(12) United States Patent
Ngo

(10) Patent No.: US 6,743,310 B1
(45) Date of Patent: Jun. 1, 2004

(54) METHOD OF FORMING NITRIDE CAPPED CU LINES WITH IMPROVED ADHESION AND REDUCED ELECTROMIGRATION ALONG THE CU/NITRIDE INTERFACE

(75) Inventor: Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 10/079,517

(22) Filed: Feb. 22, 2002

(51) Int. Cl.[7] .................................................. C22F 3/00
(52) U.S. Cl. ....................................... 148/525; 148/565
(58) Field of Search ................................. 148/525, 565

(56) References Cited

U.S. PATENT DOCUMENTS 5,960,299 A * 9/1999 Yew et al. ................... 438/424
6,143,650 A * 11/2000 Pramanick et al. ......... 438/643
6,429,049 B1 * 8/2002 Lee et al. .................... 438/122

* cited by examiner

Primary Examiner—George Wyszomierski

(57) ABSTRACT

The adhesion of a capping layer, e.g., silicon nitride, to inlaid Cu is improved with an attendant reduction in hillock formation and, hence, improvement in electromigration resistance, by laser thermal annealing the exposed surface of the inlaid Cu after CMP to remove copper oxide therefrom. Embodiments include laser thermal annealing in $NH_3$ or $H_2$ at a temperature of about 370° to about 420° for a short period of time, e.g., about 10 to about 100 nanoseconds, to remove the copper oxide. Embodiments also include sequentially and contiguously laser thermal annealing the exposed planarized surface of inlaid Cu, ramping up the introduction of $SiH_4$ and then initiating (PECVD) of a silicon nitride capping layer. Embodiments also include Cu dual damascene structures formed in dielectric material having a dielectric constant (k) less than about 3.9.

14 Claims, 5 Drawing Sheets

METHOD OF FORMING NITRIDE CAPPED CU LINES WITH IMPROVED ADHESION AND REDUCED ELECTROMIGRATION ALONG THE CU/NITRIDE INTERFACE

TECHNICAL FIELD

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to manufacturing high speed integrated circuits having submicron design features and high conductivity interconnects with improved electromigration resistance.

BACKGROUND ART

The escalating demand for high density and performance impose severe requirements on semiconductor fabrication technology, particularly interconnection technology in terms of providing a low R×C (resistance×capacitance) interconnect pattern with electromigration resistance wherein submicron vias, contacts and trenches have high aspect ratios. Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member. In addition, hillocks are generated at the interface between the inlaid Cu and silicon nitride capping layer thereby further exacerbating electromigration problems, particularly as device geometries plunge deeper into the submicron regime.

Accordingly, there exists a continuing need for methodology enabling the formation of encapsulated Cu and Cu alloy interconnects for vertical metallization levels with greater accuracy, reliability and electromigration resistance. There exists a particular continuing need for methodology enabling the formation of capped Cu or Cu alloy lines, particularly in damascene structures, e.g., dual damascene structures formed in dielectric material having a low dielectric constant (k), with improved capping layer adhesion and improved reliability and electromigration resistance, particularly along the Cu/capping layer interfaces.

DISCLOSURE OF THE INVENTION

An advantage of the present invention is a method of manufacturing a semiconductor device having highly reliable capped Cu or Cu alloy interconnects.

Another advantage of the present invention is a method of manufacturing a semiconductor device comprising a silicon nitride capped Cu or Cu alloy interconnect member with improved capping layer adhesion and improved electromigration resistance, particularly along the Cu or Cu alloy/silicon nitride capping layer interface.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a wafer containing inlaid copper (Cu) or a Cu alloy; and laser thermal annealing an exposed surface of the Cu or Cu alloy to remove oxide therefrom.

Embodiments of the present invention comprise laser thermal annealing by impinging a pulsed laser light beam on an exposed surface of inlaid Cu or a Cu alloy in $NH_3$ or $H_2$ for a brief period of time, e.g., about 10 to about 100 nanoseconds, to remove copper oxide. Laser thermal annealing in $NH_3$ or $H_2$ elevates the exposed surfaces, as to a temperature of about 370° C. to about 420° C., to completely remove or significantly remove copper oxide, thereby significantly improving adhesion of a subsequently deposited silicon nitride capping layer to the inlaid Cu or Cu alloy, while further advantageously reducing hillock formation.

Embodiments of the present invention further include introducing silane ($SiH_4$) into the reaction chamber in a plurality of stages ramping up to a deposition flow rate of about 130 to about 170 sccm before initiating RF power and depositing the silicon nitride capping layer, as at a thickness of about 450 Å to about 550 Å. Embodiments of the present invention further include single and dual damascene techniques comprising forming an opening in an interlayer dielectric on a wafer, depositing an underlying diffusion barrier layer, such as Ta and/or TaN, lining the opening and on the interlayer dielectric, depositing a seedlayer, depositing the Cu or a Cu alloy layer on the diffusion barrier layer filling the opening and over the interlayer dielectric, removing the Cu or Cu alloy layer beyond the opening by CMP leaving an exposed surface oxidized, and conveying the wafer into the chamber for processing in accordance with embodiments of the present invention by treating the exposed surface of the Cu or Cu alloy layer by laser thermal annealing in $NH_3$ or $H_2$, ramping up the introduction of $SiH_4$ and then depositing a silicon nitride capping layer on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
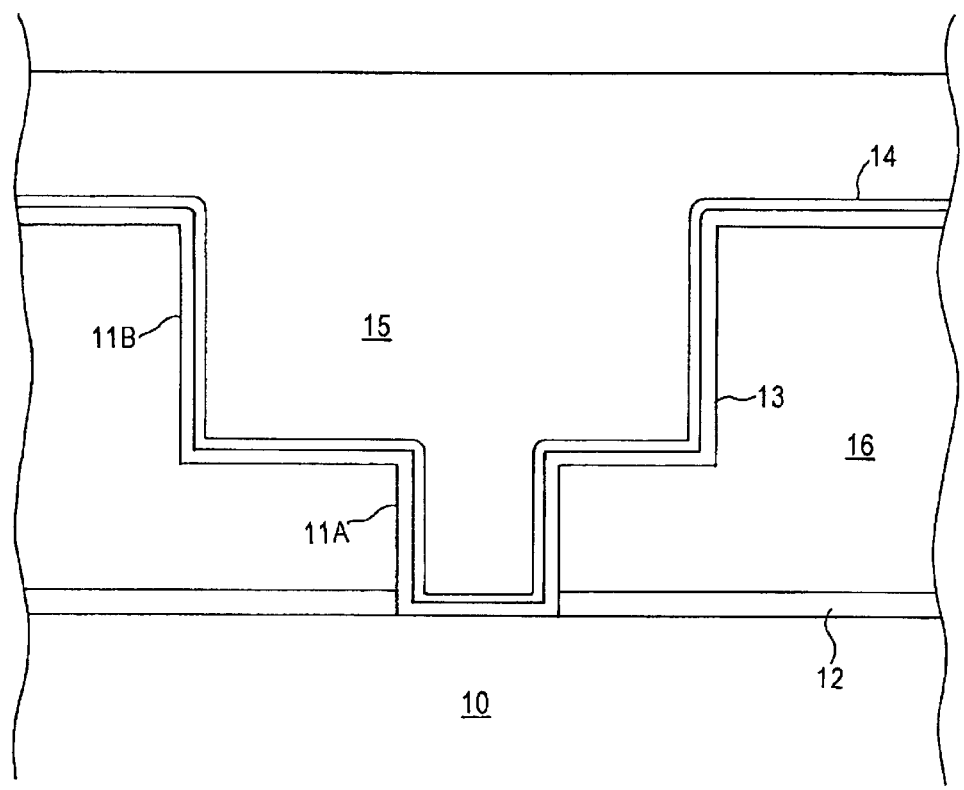
FIGS. 1–5 schematically illustrate sequential phases of a method in accordance with an embodiment of the present invention, wherein similar features or elements are denoted by like reference characters.

The present invention addresses and solves problems attendant upon forming capped Cu or Cu alloy interconnects, as with a capping layer of silicon nitride. Methodology in accordance with embodiments of the present invention enables a significant improvement in the adhesion of a capping layer, such as silicon nitride, to a Cu or Cu alloy interconnect member, thereby preventing capping layer peeling and preventing copper diffusion. In addition, embodiments of the present invention significantly reduce hillock formation, significantly improve electromigration resistance at the Cu/nitride interface, and significantly improve within wafer and wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, the electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of $CuO$ and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu interconnect member. Consequently, cracks are generated at the Cu copper oxide interface, resulting in copper diffusion and increased electromigration as a result of such diffusion. The cracks occurring in the Cu copper oxide interface enhance surface diffusion, which is more rapid than grain boundary diffusion or lattice diffusion. It was also found that plasma treatment of the exposed Cu surface to remove copper oxide leaves a highly sensitized surface prone to hillock formation, thereby further exacerbating electromigration issues. The present invention addresses and solves the capping layer adhesion problem and further reduces hillock formation by removing copper oxide from the exposed surface of inlaid Cu after CMP by laser thermal annealing. Advantageously, laser thermal annealing can be conducted by impinging a pulsed laser light beam on the exposed Cu surface in $NH_3$ or $H_2$ for a very brief period of time, e.g., about 10 to about 100 nanoseconds, thereby effecting removal of copper oxide but leaving a clean surface which is significantly less sensitized vis-à-vis that resulting from plasma treatment, with an attendant reduction in hillock formation and significant improvement in a electromigration resistance.

Embodiments of the present invention comprise a laser thermal annealing by impinging a pulsed laser light beam at a radiant fluence of about 0.09 to about 0.11 joules/cm$^2$ to elevate the temperature of the exposed Cu surfaces to about 370° C. to about 420° C., e.g., about 400° C. Embodiments of the present invention comprise laser thermal annealing employing an $NH_3$ flow rate of about 200 to about 2,000 sccm or an $H_2$ flow rate of about 200 to about 2,000 sccm.

The use of laser thermal annealing to remove copper oxide from inlaid Cu offers several advantages. For example, laser thermal annealing enables pinpoint accuracy in targeting the exposed surface of the inlaid Cu, thereby avoiding unnecessarily elevating the temperature of other portions of the wafer causing various problems, such as undue dopant impurity diffusion. In addition, the use of laser thermal annealing exposes the surface of the inlaid Cu to an elevated temperature for only a brief period of time, thereby reducing hillock formation with an attendant improvement electromigration resistant.

Laser thermal annealing of an exposed Cu surface in accordance with embodiments of the present invention has been found to be particularly effective in removing all or substantially all of the copper oxide thereon, thereby significantly enhancing capping layer adhesion while minimizing hillock formation. Accordingly, embodiments of the present invention enable a reduction in electromigration resistance, particularly along the Cu/silicon nitride capping layer interface.

In implementing embodiments of the present invention, any of various commercially available laser tools may be employed, such as those utilizing a laser source capable of operating at energies of about 10 to about 2,000 mJ/cm$^2$/pulse, e.g., about 100 to about 400 mJ/cm$^2$/pulse. Commercially available tools exist which can perform such laser annealing, either with or without mask. The Verdant Technologies laser anneal tool is but an example and operates at an exposure wavelength of 308 nm.

Given the disclosed objectives and guidance of the present disclosure, optimum PECVD conditions for depositing a silicon nitride capping layer can be determined in a particular situation. For example, suitable PECVD conditions were found to include a SiH$_4$ flow rate of about 130 to about 170 sccm, e.g., about 150 sccm, a NH$_3$ flow rate of about 250 to about 310 sccm, e.g., about 280 sccm, a N$_2$ flow rate of about 8,000 to about 9,200 sccm, e.g., about 8,600 sccm, an RF power of about 400 to about 500 watts, e.g., about 450 watts, and a spacing of about 680 to about 720 mils, e.g., about 700 mils.

In accordance with embodiments of the present invention, SiH$_4$ is slowly introduced into the chamber, after laser thermal annealing of the Cu surface to remove copper oxide. The SiH$_4$ flow rate is ramped up to a suitable deposition flow rate, as in a plurality of stages. For example, SiH$_4$ can be introduced during a first stage until a flow rate of about 70 to about 90 sccm is achieved, typically over a period of about 2 to about 5 seconds, and subsequently ramped up to a suitable deposition flow rate of about 130 to about 170 sccm, typically over a period of about 3 to about 8 seconds. Deposition of the silicon nitride capping layer is then initiated by striking a plasma at an RF power of about 400 to about 500 watts, e.g., about 450 watts, while maintaining an increased spacing to a distance of about 680 to 720 mils, e.g., about 700 mils. Typical NH$_3$ and N$_2$ flow rates for silicon nitride deposition include about 250 to about 310 sccm and about 8,000 to about 9,200 sccm, respectively.

Improved electromigration resistance of capped Cu interconnects formed in accordance with embodiments of the present invention was confirmed by lognormal sigma measurements. Lognormal sigma is a measure of spread in electromigration (EM) data (failure times). Higher signma leads to a lower projected EM lifetime at use conditions. The product EM lifetime is calculated by the following eqn: Lifetime=T50% exp(-N*sigma) where T50% is Median time to fail (MTTF) and N=6 for T0.1% failure rate and product factor of about 10$^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g, a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seed-layers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed by laser thermal annealing in NH$_3$ or H$_2$ in accordance with an embodiment of the present invention, thereby substantially eliminating or significantly reducing surface contamination and surface reaction, reducing hillock formation and, hence, significantly reducing electromigration failures.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

An embodiment of the present invention is schematically illustrated in FIGS. 1 through 5. Adverting to FIG. 1, a dual damascene opening is formed in dielectric layer 16, e.g., a low-k material. The dual damascene opening comprises a contact or via hole section 11A in communication with an upper trench section 11B. Reference numeral 12 denotes a silicon nitride capping layer/etch stop layer. A barrier layer 13 is deposited, such as Ta and/or TaN, and a seed layer 14 is then deposited. Cu 15 is then electroplated or electrolessly plated filling the dual damascene opening and forming an over burden.

Figure 2:
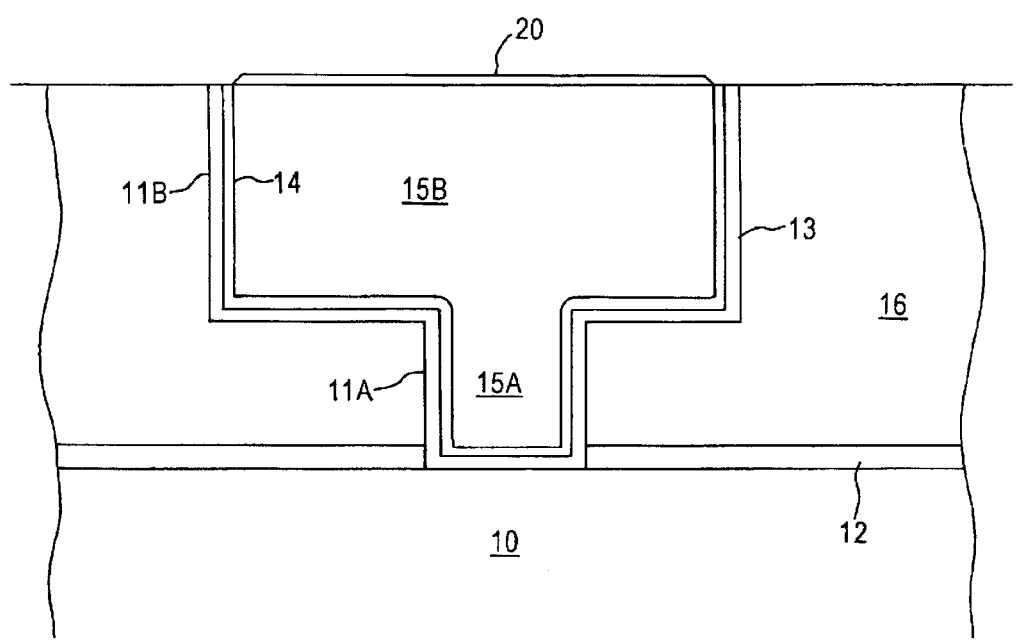

Adverting to FIG. 2, the portions of the Cu alloy layer 15 extending beyond opening 11 are removed, as by CMP. As a result, a thin film of copper oxide 20 is formed on the exposed surface of the Cu interconnect member comprising Cu line 15B which is connected to the underlying Cu via 15A. The wafer containing the Cu metallization is then introduced into a chamber and processed in accordance with embodiments of the present invention.

Figure 3:
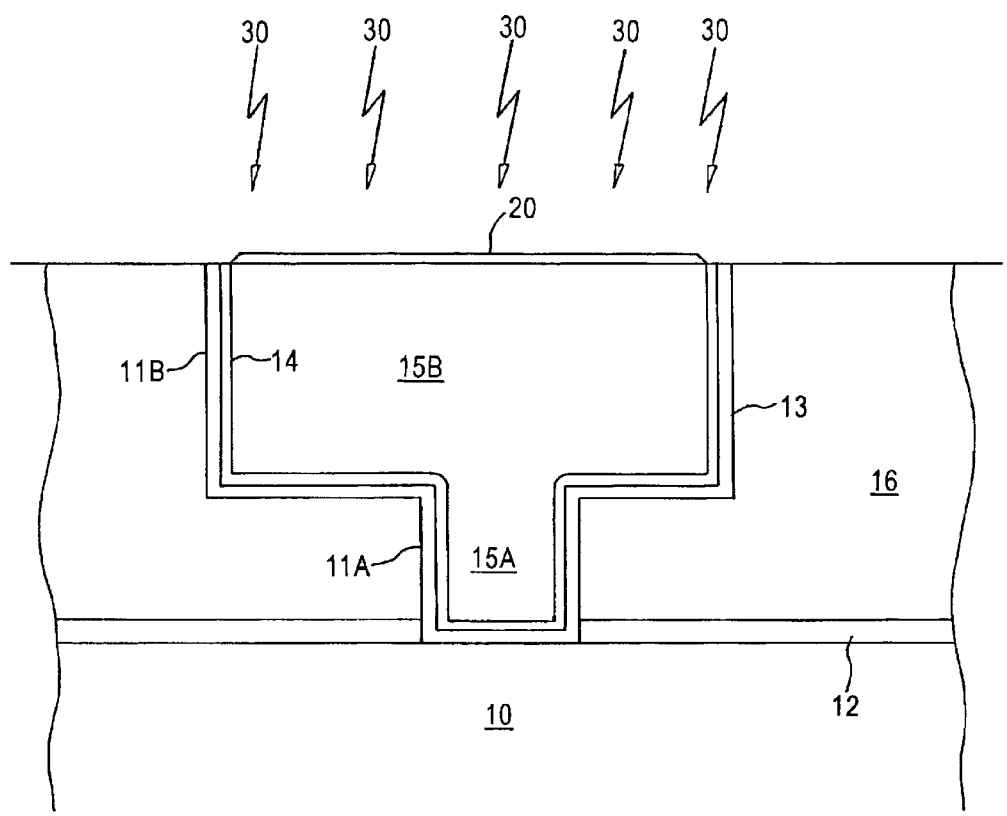
Figure 4:
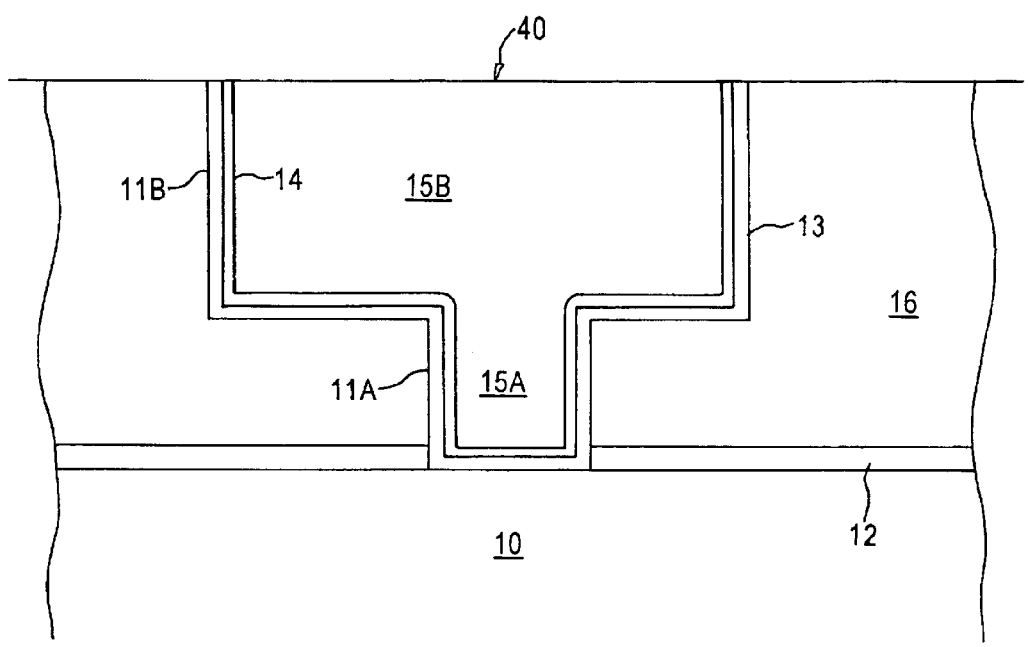

Adverting to FIG. 3, in accordance with embodiments of the present invention, the exposed surface of the Cu interconnect member having a thin copper oxide film 20 thereon is subjected to laser thermal annealing in $NH_3$ or $H_2$ by impinging a pulsed laser light beam thereon, as illustrated by arrows 30, thereby elevating the surface temperature to about 400° C. for a brief period of time to remove or substantially reduce the thin copper oxide film 20, leaving a clean Cu surface 40 as illustrated in FIG. 4.

Figure 5:
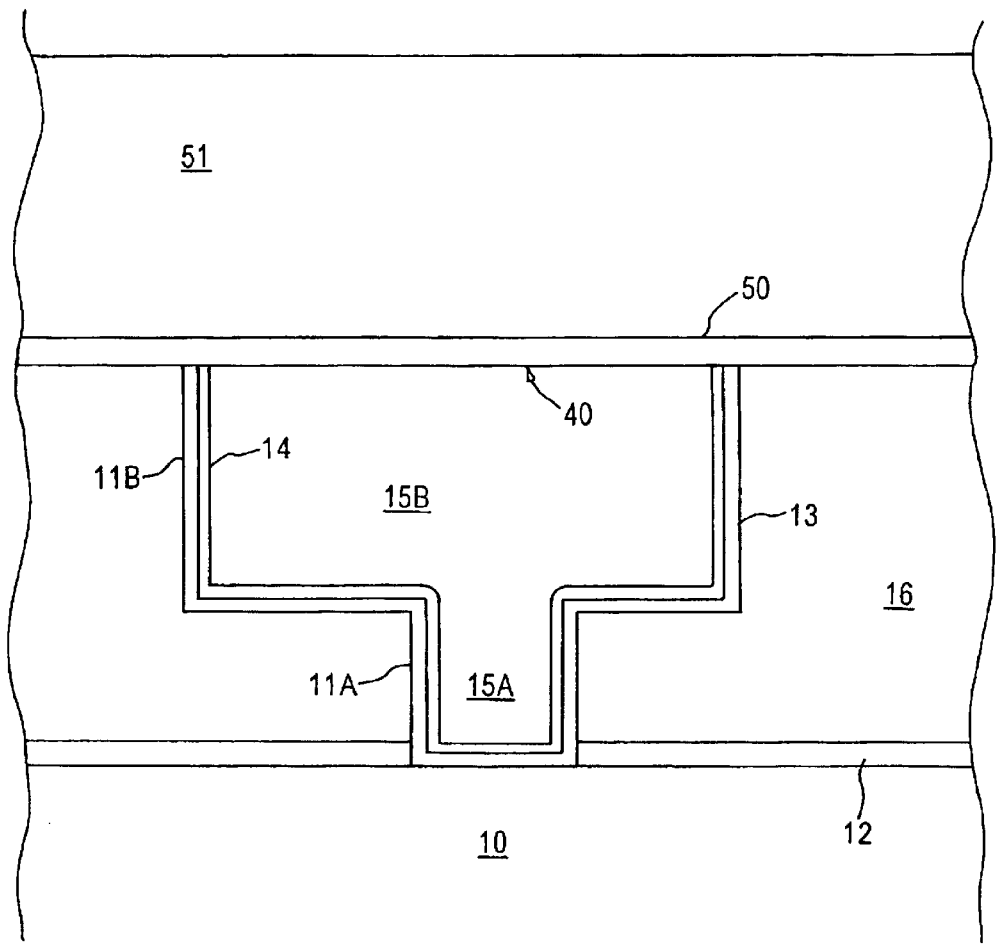

As shown in FIG. 5, silicon nitride capping layer 50 is deposited on the cleaned exposed surface 40 of Cu interconnect line 15B. Another interlayer dielectric 51 is then deposited, such as a low-k material. In this way, a plurality of interlayer dielectrics and metallization patterns are built up on a semiconductor substrate and various interconnects are formed.

Advantageously, the inventive methodology enables a significant improvement in capping layer adhesion and reduced hillock formation, thereby significantly reducing electromigration failures stemming from diffusion along the Cu/silicon nitride capping layer interface. Consequently, the present invention advantageously reduces capping layer peeling, reduces copper diffusion, enhances electromigration resistance, improves device reliability, improves within wafer and wafer-to-wafer uniformity, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

It is claimed:

1. A method of manufacturing a semiconductor device, the method of comprising:

forming a wafer containing copper (Cu) or a Cu alloy filling an opening formed in a dielectric layer; and laser thermal annealing an exposed surface of the Cu or Cu alloy to remove oxide therefrom.

2. The method according to claim 1, comprising laser thermal annealing at a temperature of about 370° C. to about 420° C.

3. The method according to claim 2, comprising laser thermal annealing for about 10 to about 100 nanoseconds.

4. The method according to claim 1, wherein the wafer contains a dual damascene structure comprising a Cu or Cu alloy line in contact with an underlying Cu or Cu alloy via formed in a dielectric layer.

5. The method according to claim 4, wherein the dielectric layer comprises a material having dielectric constant less than about 3.9.

6. A method of manufacturing a semiconductor device, the method of comprising:

forming a wafer containing inlaid copper (Cu) or a Cu alloy; and laser thermal annealing in ammonia ($NH_3$) or hydrogen ($H_2$) an exposed surface of the Cu or Cu alloy to remove oxide therefrom.

7. The method according to claim 6, comprising laser thermal annealing in NH3 at an NH3 flow of about 200 to about 2,000 sccm.

8. The method according to claim 6, comprising laser thermal annealing in H2 at an H2 flow rate of about 200 to about 2,000 sccm.

9. The method according to claim 6, comprising laser thermal annealing at a temperature of about 370° C. to about 420° C.

10. The method according to claim 9, comprising laser thermal annealing by impinging a pulsed laser light beam on the exposed surface at a radiant fluence of about 0.09 to about 0.11 joules/cm2.

11. The method according to claim 9, comprising laser thermal annealing for about 10 to about 100 nanoseconds.

12. A method of manufacturing a semiconductor device, the method of comprising:

forming a wafer containing inlaid copper (Cu) or a Cu alloy;

laser thermal annealing an exposed surface of the Cu or Cu alloy to remove oxide therefrom; and depositing a silicon nitride capping layer on the treated Cu surface.

13. The method according to claim 12, comprising depositing the silicon nitride capping layer by plasma enhanced chemical vapor deposition (PECVD).

14. The method according to claim 13, comprising depositing the silicon nitride capping layer at a thickness of about 450 Å to about 550 Å.

* * * * *